United States Patent
Huang

(10) Patent No.: US 6,280,224 B1
(45) Date of Patent: Aug. 28, 2001

(54) ELECTRICAL CONNECTOR HAVING A METALLIC INSERTED PLATE

(75) Inventor: Yao-Chi Huang, Yung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/535,440

(22) Filed: Mar. 23, 2000

Related U.S. Application Data

(63) Continuation-in-part of application No. 09/478,266, filed on Jan. 5, 2000.

(51) Int. Cl.$^7$ .................................................. H01R 13/625
(52) U.S. Cl. .................................................. 439/342
(58) Field of Search ........................... 439/342, 259–270

(56) References Cited

U.S. PATENT DOCUMENTS 6,071,140 * 6/2000 McHugh et al. ..................... 439/342
6,086,402 * 6/2000 Huang ................................... 439/342

* cited by examiner

Primary Examiner—Gary F. Paumen
(74) Attorney, Agent, or Firm—Wei Te Chung

(57) ABSTRACT

An electrical connector of the present invention comprises a base, a cover slidably supported on the base, a ring insert molded in the cover, a cam box insert molded in the base, a cam actuator extending through the ring and the cam box, a metallic inserted plate, and a washer. The base has a plurality of passageways to retain a plurality of contacts therein. The cover has a plurality of holes to retain a plurality of pins of a PGA chip mounted thereon. The metallic inserted plate is insert molded in the base, and comprises a base portion and a pair of legs extending from the base portion. An elongated aperture is defined in the base portion for extension of the cam actuator therethrough. The aperture is located above the cam box and extends in a direction perpendicular to the direction of movement of the cover. In addition, a plurality of cavities are defined in the metallic inserted plate, and a plurality of corresponding bulges are formed on the base which holding the cavities and firmly fix the metallic inserted plate firmly to the base.

1 Claim, 4 Drawing Sheets

ELECTRICAL CONNECTOR HAVING A METALLIC INSERTED PLATE

This is a continuation-in-part application of the copending application Ser. No. 09/478,266 filed Jan. 5, 2000.

BACKGROUND OF THE INVENTION

The present invention relates to a ZIF PGA socket connector having a cam actuator, and particularly to a connector using a cam actuator which has a metallic inserted plate for use with.

U.S. Pat. No. 4,496,205 ('205 patent) and Taiwan Patent No. 85107705 disclose a type of ZIF socket. The socket in the '205 patent is for use in mounting a PGA chip onto a printed circuit board (PCB) and comprises a base and a cover mounted onto the base. The base and the cover each define a cam box therebetween, and a cam means is engaged with both cam boxes to rotate therein to drive the cover, whereby the cover slides on the base. Since the cover and base are both made of plastic, after a period of use of the socket, the cam box become enlarged because of the wear between the cover and base and the cam means. After this happens, the cam means can no longer drive the cover accurately. In a word, the socket has a durability problem. In addition, the cam means may cause the cam box of the cover to curl up during the pivot; this further prevents engagement between the pins of the connector and the contacts of the PGA chip. Hence, an improved electrical connector is required to overcome the disadvantages of the prior art.

BRIEF SUMMARY OF THE INVENTION

The object of the present invention is to provide an electrical connector having a more durable cam actuator and base which prevents wear on the cam actuator and warpage of the base.

Accordingly, an electrical connector of the present invention comprises a base, a cover slidably supported on the base, a ring insert molded in the cover a cam box insert molded in the base, a cam actuator extending through the ring and the cam box, a metallic inserted plate, and a washer. The base has a plurality of passageways to retain a plurality of contacts therein. The cover has a plurality of holes to retain a plurality of pins of a PGA chip mounted thereon. The metallic inserted plate is insert molded in the base, and comprises a base portion and a pair of legs extending from the base portion. An elongated aperture is defined in the base portion for extension of the cam actuator therethrough. The aperture is located above the cam box and extends in a direction perpendicular to the direction of movement of the cover. In addition, a plurality of cavities are defined in the metallic inserted plate, and a plurality of corresponding bulges are formed on the base which holding the cavities and firmly fix the metallic inserted plate firmly to the base.

Other objects, advantages and novel features of the invention will become more apparent from the following detailed description of the present embodiment when taken in conjunction with the accompanying drawings.

DETAILED DESCRIPTION OF THE INVENTION

Figure 1:
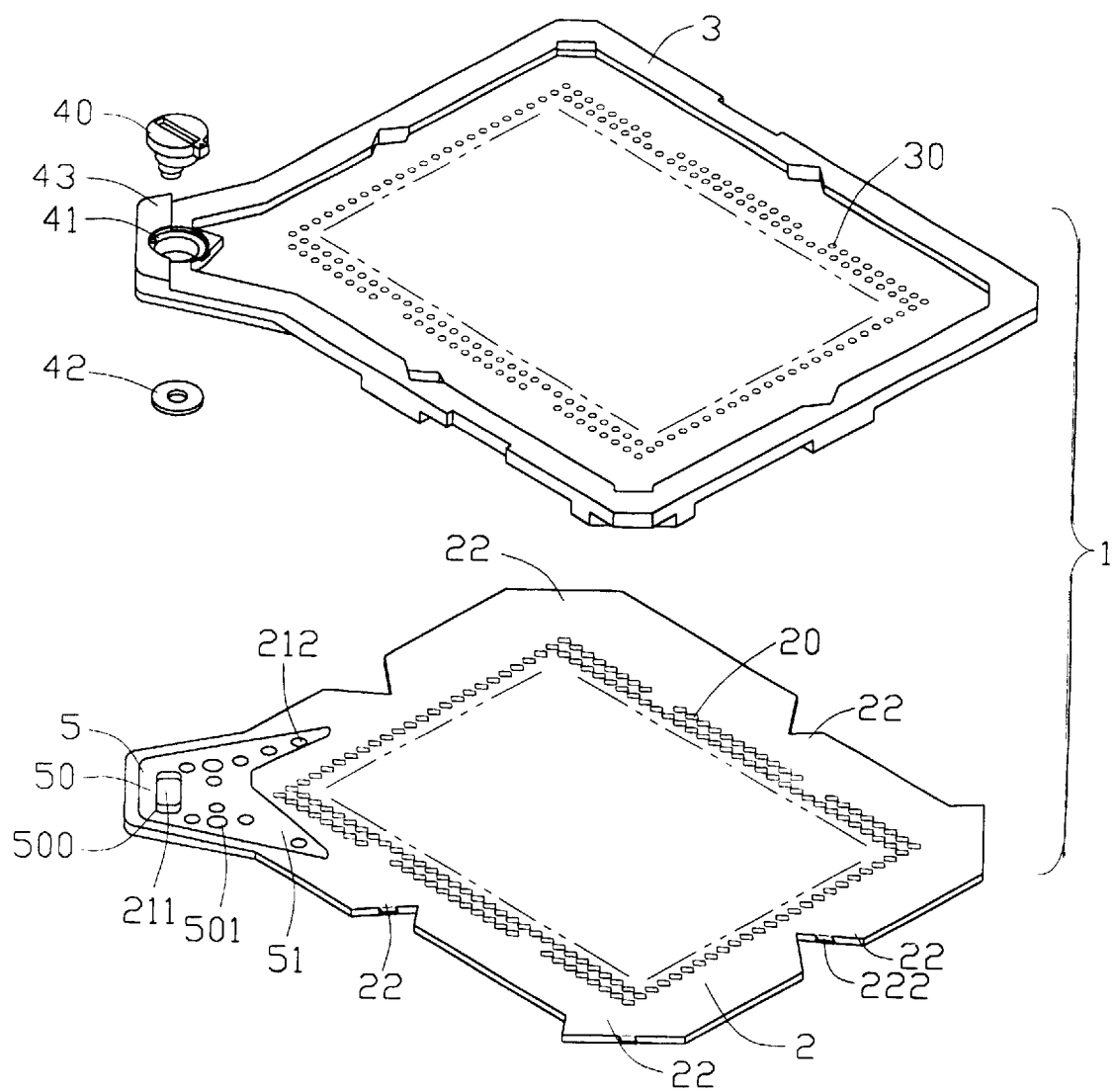
FIG. 1 is an exploded view of an electrical connector in accordance with the present invention.
Figure 2:
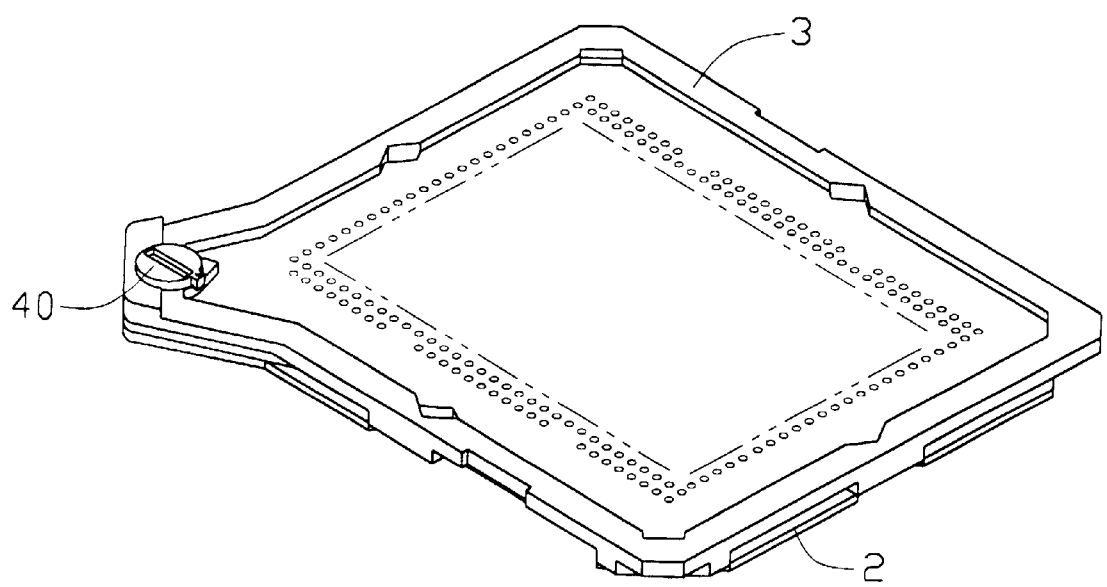
FIG. 2 is an assembled view of the electrical connector in accordance with the present invention.

Referring to FIGS. 1–4, an electrical connector 1 in accordance with the present invention comprises a base 2, a cover 3 slidably supported on the base 2, a ring 41 insert molded in the cover 3, a cam box 211 insert molded in the base 2, a cam actuator 40, a metallic inserted plate 5, and a washer 42. A plurality of contact passageways 20 and holes 30 are defined in the base 2 and the cover 3 respectively. The passageways 20 are used for retaining corresponding contacts (not shown) therein. The holes 30 are used for extension of corresponding pins (not shown) of an electronic package therethrough when the package is mounted on the connector. A key 222 protrudes from each of a plurality of selected edge 22 of the base 2, while a plurality of protrusions 32 extend downwards from the cover 3 to slidably engage with the keys 222.

The base 2 is generally in the shape of a square, and the cover 3 has a shape corresponding to that of the base 2. The ring 41 and the cam box 211 are positioned in corresponding corners of the cover 3 and the base 2 respectively. The ring 41 further defines a stepped inner surface suited to engage with the cam actuator 40. A stop wall 43 is formed outside the ring 41 to provide over rotation stop for the cam actuator 40.

The cam actuator 40 comprises an upper potion 400, a middle portion 401 and a lower portion 402 in turn. The upper portion 400 is received in the ring 41, the middle portion 401 is received in the inserted plate 5 and the cam box 211, and the lower portion 402 is riveted to the washer 42 (see FIG. 4). The related detailed descriptions about the ring 41, the cam actuator 40 and the operation of the connector 1 are disclosed in the copending parent application Ser. No. 09/478,266 filed Jan. 5, 2000 of the inventor of this application and having the same assignee, and are wholly incorporated herein by reference.

Figure 3:
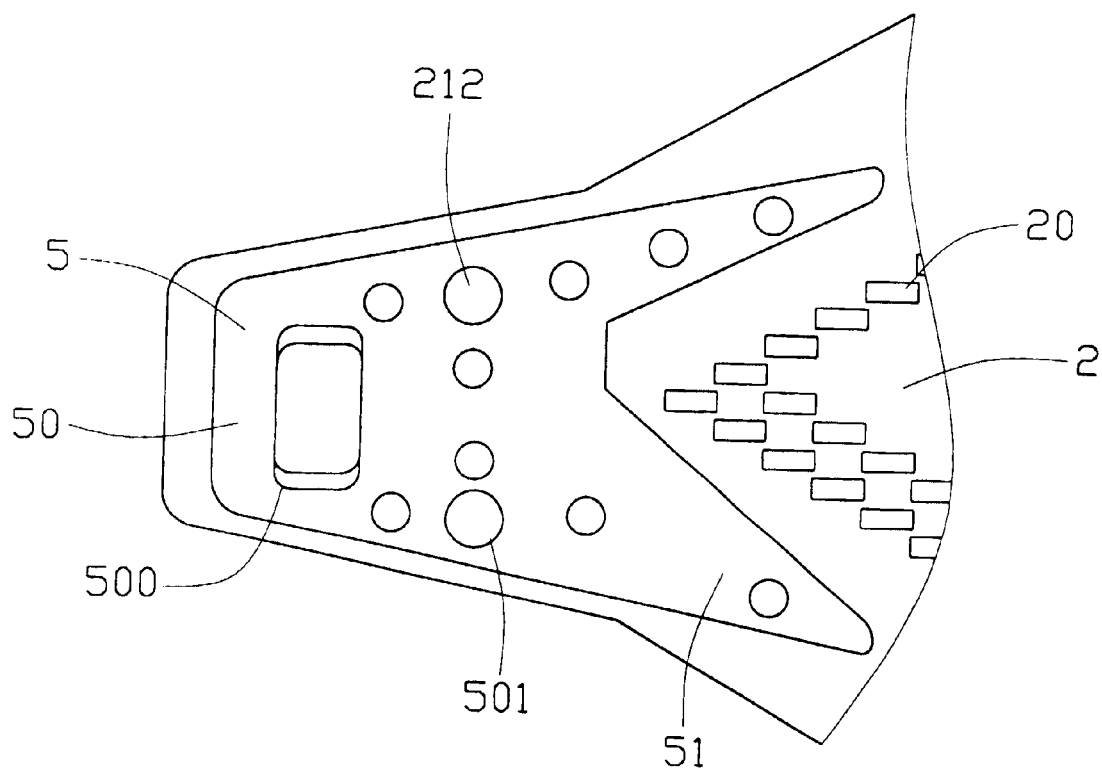
FIG. 3 is a partial top view of a base of the electrical connector in accordance with the present invention.
Figure 4:
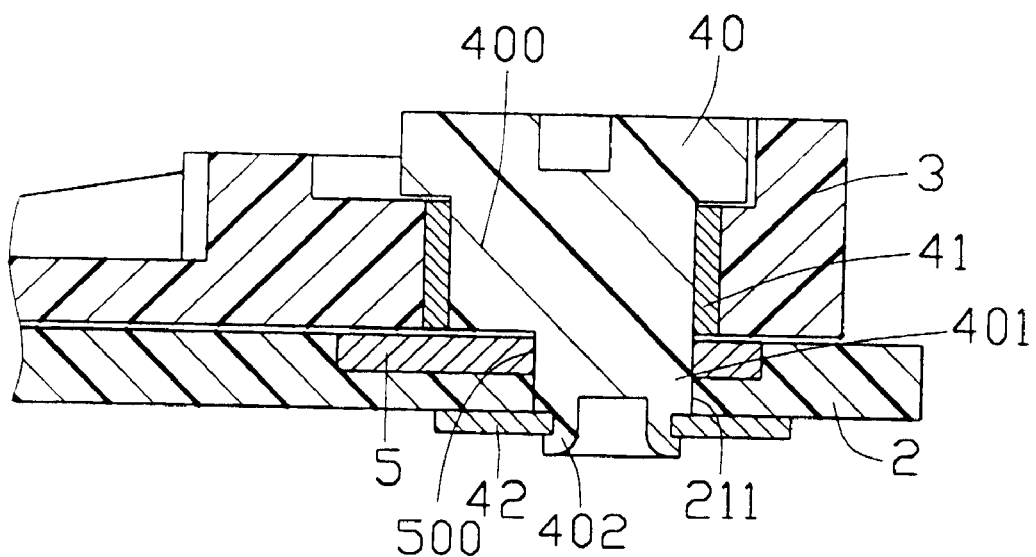
FIG. 4 is a partial cross-sectional view of the electrical connector in accordance with the present invention.

Referring to FIGS. 1, 3 and 4, the metallic inserted plate 5 is insert molded in the base 2 at the same corner with the cam box 211. The metallic inserted plate 5 comprises a base portion 50 and a pair of legs 51 extending from the base portion 50 to increase structural strength. These legs are designed to prevent the base 2 from curling up when a tool (not shown) is used to drive the cover 3 diagonally along the base 2. An elongated aperture 500 is defined in the base portion 50, and the aperture 500 is located above the cam box 211 and extends in a direction perpendicular to the direction of movement of the cover 3. In addition, the base portion 50 and the legs 51 further define a plurality of cavities 501, and the base 2 forms a plurality of corresponding bulges 212 for inserting into the cavities 501. The engagement of the cavities 501 and the bulges 212 assure stable mounting of the inserted plate 5 in the base 2.

Referring to FIG. 4, in assembly, the cover 3 is slidably mounted on the base 2 and the cam actuator 40 is inserted through the ring 41, the inserted plate 5 and the cam box 211 in turn. The metallic inserted plate 5 effectively increases the durability of the plastic cam box 211 and prevents warpage of the base 2 caused by rotation of the cam actuator 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad (general meaning of the terms in which the appended claims are expressed.

What is claimed is:

1. An electrical connector comprising:

a base having a plurality of passageways to retain a plurality of contacts therein;

a cover slidably supported on the base, and having a plurality of holes to retain a plurality of pins therein;

a drive means located in the base and the cover for driving the cover to move on the base, and having a ring insert molded in the cover, a cam box molded in the base, and a cam actuator extending through the ring and the cam box, said cam actuator being rotatable within the ring to move the cover; and a metallic inserted plate insert molded in the base, and having an aperture through which the cam actuator extends, said cam actuator being in constant engagement with said metallic inserted plate;

wherein the metallic inserted plate comprises a base portion and a pair of legs extending from the base portion;

wherein the aperture has an elongated shape;

wherein the aperture is located above the cam box and extends in a direction perpendicular to the direction of movement of the cover;

wherein a plurality of cavities are defined in the metallic inserted plate, and a plurality of corresponding bulges are formed on the base for engaging within the cavities to firmly fix the metallic inserted plate to the base.

* * * * *